United States Patent [19]

Tsukamoto

[11] Patent Number: 5,047,818
[45] Date of Patent: Sep. 10, 1991

[54] SEMICONDUCTOR MEMORY DEVICE HAVING BURIED STRUCTURE TO SUPPRESS SOFT ERRORS

[75] Inventor: Katsuhiro Tsukamoto, Hyogo, Japan

[73] Assignee: Mitsubishi Denki Kabushiki Kaisha, Tokyo, Japan

[21] Appl. No.: 662,989

[22] Filed: Feb. 28, 1991

Related U.S. Application Data

[63] Continuation of Ser. No. 146,686, Jan. 20, 1988, abandoned.

[30] Foreign Application Priority Data

Feb. 19, 1987 [JP] Japan ................ 62-37482

[51] Int. Cl.⁵ ............... H01L 27/68; H01L 29/92; H01L 27/02
[52] U.S. Cl. .................. 357/23.6; 357/14; 357/41; 357/51; 357/88; 357/90
[58] Field of Search .............. 357/23.6, 51, 14, 41, 357/48, 88, 90

[56] References Cited

U.S. PATENT DOCUMENTS 4,355,374 10/1982 Sakai et al. .................. 357/23.6
4,745,454 5/1988 Erb .................................. 357/23.6

FOREIGN PATENT DOCUMENTS 3642595 6/1987 Fed. Rep. of Germany ..... 357/23.6
58-107667 6/1983 Japan .
60-154664 8/1985 Japan ................ 357/23.6
61-252658 11/1986 Japan ................ 357/23.6
62-208662 9/1987 Japan ................ 357/23.6

OTHER PUBLICATIONS

"Dynamic Ram Cell Structure", IBM Technical Disclosure Bulletin, vol. 27, No. 12, May 1985.
IEDM,"A Buried N-Grid for Protection Against Radiation Induced Charge Collection in Electronic Circuits", by M. R. Wordeman et al., pp. 40-43, 1981.
IEEE Transaction on Electron Device, "The Hi-C RAM Cell Concept", by Al F. Tasch et al., vol. ED-25, No. 1, Jan. 1978, pp. 33-41.

Primary Examiner—Andrew J. James
Assistant Examiner—Ngan Van Ngo
Attorney, Agent, or Firm—Lowe, Price, LeBlanc and Becker

[57] ABSTRACT

A semiconductor memory device comprises a capacitor and a transistor formed on a main surface of a semiconductor substrate and a buried layer of high impurity concentration formed in the substrate, wherein the buried layer has the same conductivity type as that of the substrate and is formed shallow under the capacitor and deep under the transistor.

14 Claims, 4 Drawing Sheets

FIG.4A
FIG.4B
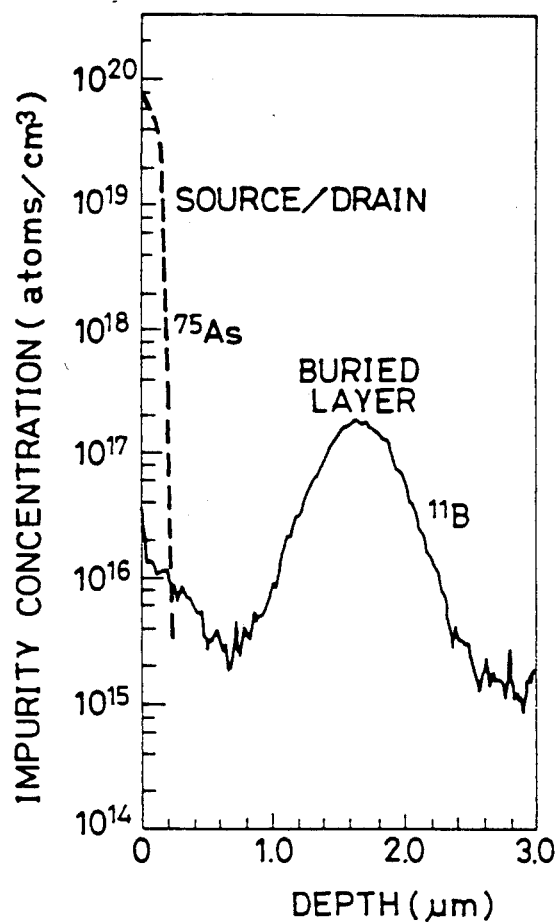
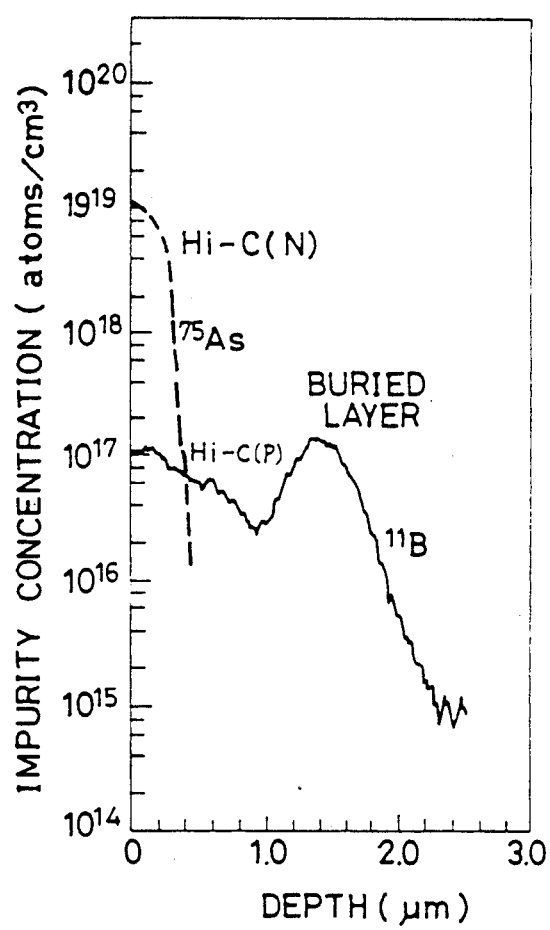

SEMICONDUCTOR MEMORY DEVICE HAVING BURIED STRUCTURE TO SUPPRESS SOFT ERRORS

This application is a continuation of application Ser. No. 07/146,686 filed Jan. 20, 1988 now abandoned.

BACKGROUND OF THE INVENTION

1. Field of the Invention

The present invention relates to a semiconductor memory device and, more specifically, it relates to a semiconductor memory device and a method for making the same in which soft errors induced by a particles or the like are hard to occur.

2. Description of the Prior Art

A semiconductor memory device comprising one-transistor type dynamic memory cell is widely used for a memory capacity of 4Kbit to 1Mbit, since its structure is simple and suitable for high integration. The one-transistor type dynamic memory cell, comprising a charge storage capacitor and a write/read transistor, has a problem of soft errors, that is, carriers generated in the silicon substrate by an ionizing radiation such as $\beta$ particles and the like are collected in the memory cell and the stored contents are destroyed.

Various memory cells are proposed which are devised to have protective structures against such soft errors. FIG. 1 is a cross sectional view of a memory cell having a Hi-C structure disclosed in, for example, IEEE. Tans. Electron Devices, vol. ED-25 (1978), pp. 33–41, "The Hi-C RAM Cell Concept", by A. F. Tasch et al.. The memory cell of FIG. 1 comprises a P− type silicon substrate 1, a field oxide film 2 for isolation, a channel stop P+ region 3 for isolation, an insulator film 4 for a capacitor, a cell plate electrode 5 forming an opposed electrode of a charge storage capacitor, a word line 6 associated with a write/read transistor, an N+ region 7 connected to a bit line, a contact hole 8, a bit line 9, and an N+ region 11 and a P region 12 related to the Hi-C structure.

In this memory cell, a P-N junction comprised of the N+ region 11 and the P region 12 is formed in the silicon substrate under the charge storage capacitor and then the charge storage capacitance is increased by this P-N junction capacitance added in parallel to the MOS capacitance. In this case, the impurity concentration in the P region 12 is fairly high compared with that in the silicon substrate 1. This structure restrains the extension of the depletion layer, so that the funneling phenomenon is suppressed. This structure also serves as a barrier against carriers diffusing from the substrate 1 into the N+ region 4, remarkably reducing the number of carriers to be collected, thereby reducing occurrences of soft errors.

However, in the conventional semiconductor memory device, there was no measure to cope with the collection of carriers in the N+ region 7 connected to the bit line 9. Namely, the conventional device is not protected against soft errors in this portion.

Meanwhile, a buried N type grid in a P type substrate for protection against radiation induced charge collection is described in IEDM Tech. Dig., 1981, pp. 40–43, by M. R. Wordeman et al. and a buried P+ type layer in a P type substrate is described in Japanese Patent Laying-Open Gazette 107667/1983 (corresponding to the U.S. patent application Ser. No. 333,230). However, there still exists some room to make further improvement in relation to soft errors in a prior art semiconductor memory device.

SUMMARY OF THE INVENTION

In view of the prior art, a main object of the present invention is to provide a semiconductor memory device and a method for making the same which has a protective structure not only against soft errors caused in the charge storage capacitor region but also against soft errors caused in the high impurity concentration region connected to the bit line.

According to an aspect of the present invention, a semiconductor memory device comprises a semiconductor substrate of a certain conductivity type having a main surface with said substrate of prescribed impurity concentration for the certain conductivity type, a charge storage capacitor and a write/read transistor formed on the main surface, a buried layer formed in the substrate having an impurity concentration for the certain conductivity type higher than that of the substrate with the buried layer formed shallow under the capacitor and deep under the transistor.

According to another aspect of the present invention, a method for manufacturing a semiconductor memory device comprises the steps of preparing a semiconductor substrate of a certain conductivity type having a main surface, forming a charge storage capacitor and a write/read transistor on the main surface, providing a moderator only on the capacitor and implanting impurity ions for the certain conductivity type from the main surface into the substrate, thereby forming a buried layer which is comparatively shallower under the capacitor and comparatively deeper under the transistor.

In the present invention, the buried layer having high impurity concentration of the same conductivity type as the substrate restrains the extension of the depletion layer of the N+-P junction to suppress the funneling phenomenon and, in addition, it serves as a barrier against carriers diffusing from the inside of the semiconductor substrate into the regions having different conductivity type from that of the substrate, thereby significantly reducing the number of carriers to be collected. Furthermore, since the depth of the buried layer is shallow under the charge storage capacitor, in the device having the Hi-C structure it is almost contiguous to the high impurity concentration region of the Hi-C structure thereby forming an almost continuous high concentration region of the same conductivity type as that the substrate, extremely reducing the number of carriers to be collected. Further, since the depth of the buried layer is deep under the write/read transistor, it prevents bad influences on the transistor function.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 4A and 4B are graphs showing the impurity concentration distributions in the depth direction of the semiconductor memory device of FIG. 2.

DESCRIPTION OF THE PREFERRED EMBODIMENTS

Figure 1:
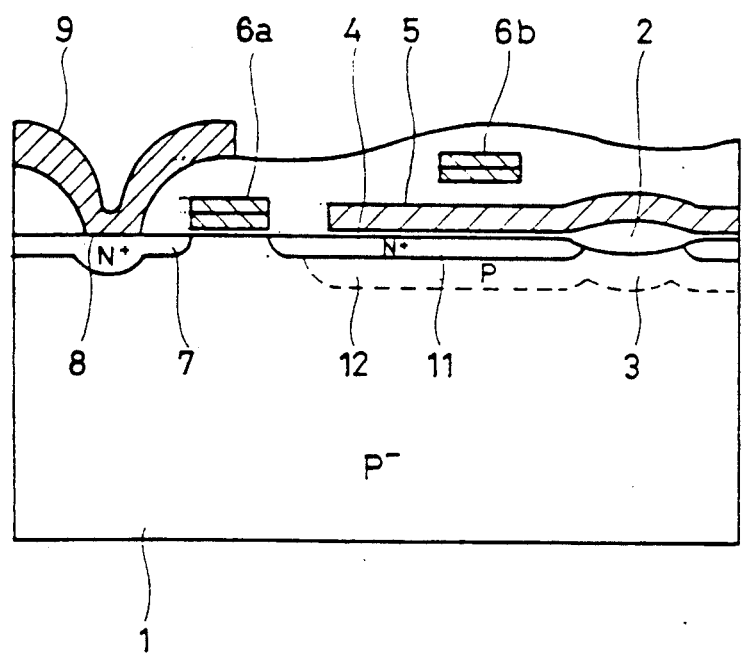
FIG. 1 is a cross sectional view showing a conventional semiconductor memory device.
Figure 2:
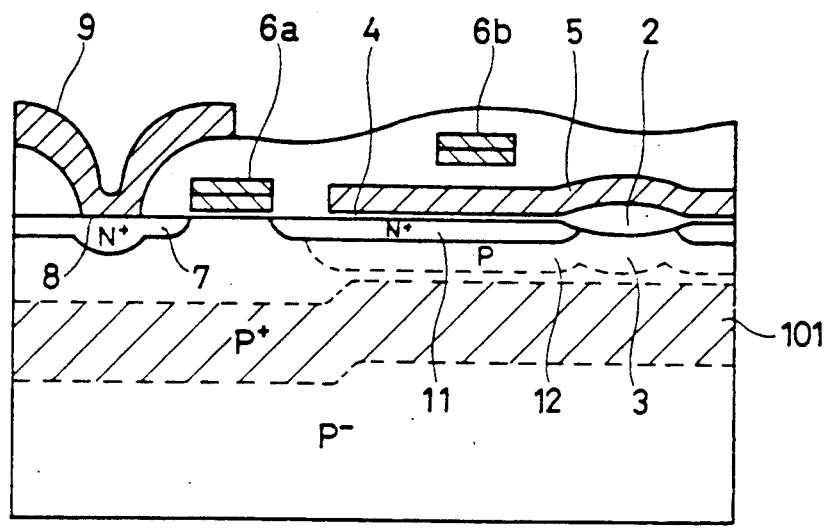
FIG. 2 is a cross sectional view showing the structure of a semiconductor memory device according to one embodiment of the present invention.

Referring to FIG. 2, portions 1 to 12 are the same as those in the conventional structure shown in FIG. 1. The P buried layer 101 of high impurity concentration restrains the extension of the depletion layer of the N+-P junction to suppress the funneling phenomenon and it also serves as a barrier against carriers.

In the charge storage capacitor of the memory cell, a MOS capacitor comprising a cell plate 5, an insulator film 4 and an N+ charge storage node 11, and an N+-P junction capacitor (Hi-C structure) comprising the N+ region 11 and the P region 12 are formed in parallel. A P type buried layer 101 of high impurity concentration is formed almost in continuation with the Hi-C P region 12. Therefore, a very thick P region of high impurity concentration formed of the Hi-C P region 12 and the P type buried layer 101 exists under the charge storage capacitor, and this structure significantly suppresses the collection of the $\alpha$ ray induced carriers into the N+ region 11.

Under the N+ region 7 connected to the bit line 9, the P type buried layer 101 is made rather deep to set the peak position of impurity concentration at a depth of 1 to 2 $\mu$m. This structure significantly reduces the collection of the $\alpha$ ray induced carriers into the N+ region 7 without causing bad influences on the various electrical characteristics of the write/read transistor, such as a rise in the threshold voltage $V_{th}$, increase of the substrate bias effect, a drop of the junction breakdown voltage or the like, and without increasing the junction capacitance (which is a part of the bit line capacitance) of the N+ region 7 connected to the bit line 9.

The ion implantation of boron using an accelerating energy of 0.7 to 2 MeV is most preferred in forming the P type buried layer 101 of high impurity concentration. The P type buried layer 101 should be made shallow under the charge storage capacitor, so that the ion implantation should be carried out after a mask, which serves as a moderator, is formed on the charge storage capacitor.

Figure 3:
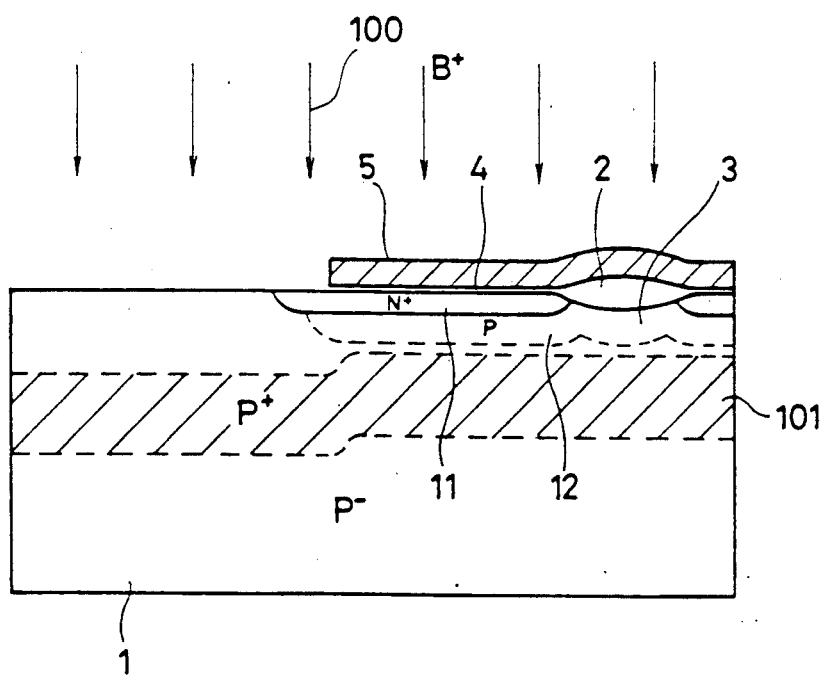
FIG. 3 is a cross sectional view showing a method for manufacturing the semiconductor memory device of FIG. 2.

FIG. 3 is a cross sectional view showing the manufacturing process of the P type buried layer 101. As shown in this figure, by forming a pattern of cell plate 5 made of an electrode material such as polysilicon and then by implanting boron ion 100, the implanted boron can be distributed shallow under the charge storage capacitor. When the boron is implanted with an energy of 0.7 to 2 MeV, the peak of the boron distribution is positioned at a depth of 1.35 to 2.8 $\mu$m in the region without the cell plate 5 serving as a moderator. On the other hand, in the region under the cell plate 5, assuming that the thickness of the cell plate 5 is 0.5 $\mu$m, the peak of the boron distribution is positioned at a depth of 0.85 to 2.3 $\mu$m, so that the P type buried layer 101 can be made shallow in self-alignment with the charge storage region. The peak impurity concentration is preferably in the range of $1 \times 10^{17}$ to $1 \times 10^{19}/cm^3$.

FIGS. 4A and 4B show the impurity distributions under the bit line N+ region 7 and under the charge storage capacitor, respectively, measured by the secondary ion mass spectrometry. Boron was implanted with 1 MeV at a dose rate of $1 \times 10^{13}/cm^2$ and the concentration peak depth under the bit line N+ region 7 was 1.67 $\mu$m as shown in FIG. 4A. Therefore, the buried P region 101 can be formed which effectively reduces the collection of the $\alpha$ ray induced carriers into the n+ region 7, without significantly dropping the junction breakdown voltage between the N+ layer 7 and the substrate 1, also without significantly increasing the junction capacitance, and further without causing bad influences such as a rise in the threshold voltage of the write/read transistor. Under the charge storage capacitor, as shown in FIG. 4B, the P type buried layer 101 of high impurity concentration overlaps with the Hi-C P region 12, forming a continuous, comparatively thick (about 2 $\mu$m) P region. Therefore, the collection of the $\alpha$ ray induced carriers into the N+ region 11 can be significantly reduced.

Figure 5:
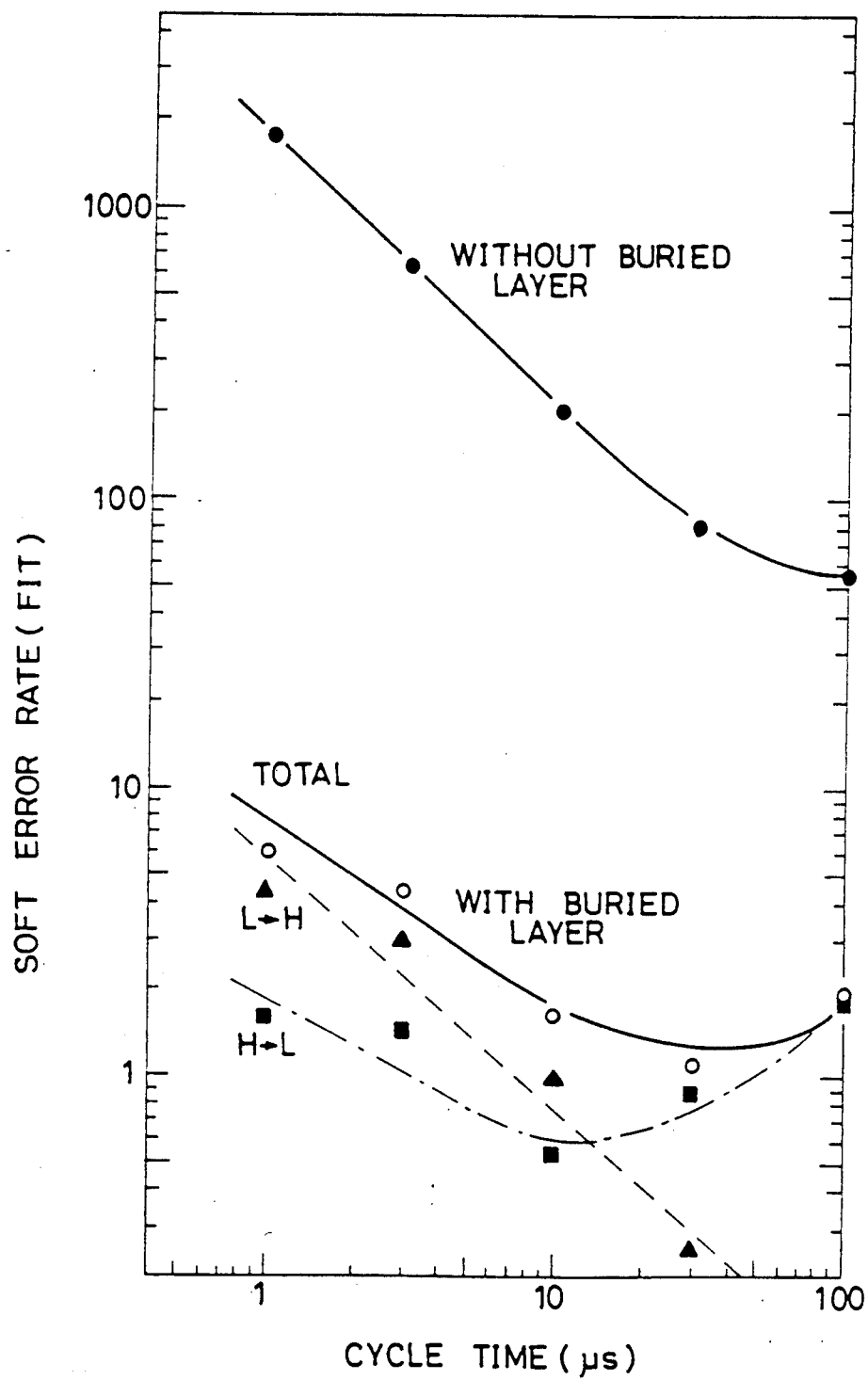
FIG. 5 is a graph showing the effect of suppressing soft errors according to the present invention.

FIG. 5 is related to the soft errors of a 1Mbit dynamic memory ($V_{CC}=5$ V) formed by using the present invention, and it shows the cycle time dependency of the soft error rate (FIT: failure in time) in case there is provided a buried barrier and there is no buried barrier. As is apparent from this figure, when there is provided a buried barrier, the soft error rate is decreased to about 1/100 compared with the case having no buried barrier, and both the cell mode errors and the bit line mode errors are decreased.

Although an N channel type device was used in the memory cell in the above embodiment, the same effect as in the above described embodiment can be obtained using a P channel type device, by using phosphorus or arsenic in place of boron.

Although a planar type capacitor cell is described in the above embodiment, the present invention provides the same effect in a trench type or a layered structure type capacitor cells.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a semiconductor substrate of a certain conductivity type having a main surface, with said substrate having a prescribed impurity concentration for said certain conductivity type;
   a charge storage capacitor and a write/read transistor having a gate formed on said main surface; and
   a continuous buried layer formed in said substrate having an impurity concentration higher than that in said substrate for said certain conductivity type, wherein said buried layer is formed at a first depth beneath the capacitor and at a second depth greater than the first depth beneath said transistor gate, said continuous buried layer being vertically separated from said capacitor and said transistor.

2. A semiconductor memory device according to claim 1, wherein
   the peak value of the impurity concentration of said buried layer is in the range of $1 \times 10^{17}$ to $1 \times 10^{19}/cm^3$.

3. A semiconductor memory device according to claim 1, wherein the conductivity type of said substrate is of a P type, said capacitor is of a MOS type having a Hi-C structure with said Hi-C structure including an N layer and a P layer along the main surface of said substrate for providing an additional P-N junction capacitance, and said P layer and said buried layer are almost contiguously formed together in said substrate.

4. A semiconductor memory device according to claim 2, wherein the conductivity type of said substrate is of a P type, said capacitor is of a MOS type having a Hi-C structure, with said Hi-C structure including an N layer and a P layer along the main surface of said substrate for providing an additional P-N junction capacitance, and said P layer and said buried layer are almost contiguously formed together in said substrate.

5. A semiconductor memory device according to claim 1, wherein the conductivity type of said substrate is of an N type, said capacitor is of a MOS type having a Hi-C structure, with said Hi-C structure including a P layer and an N layer along the main surface of said substrate for providing an additional P-N junction capacitance, and said N layer and said buried layer are almost contiguously formed together in said substrate.

6. A semiconductor memory device according to claim 2, wherein the conductivity type of said substrate is of an N type, said capacitor is of a MOS type having a Hi-C structure, with said H-C structure including a P layer and an N layer along the main surface of said substrate for providing an additional P-N junction capacitance, and said N layer and said buried layer are almost contiguously formed together in said substrate.

7. A semiconductor memory device comprising:
a semiconductor substrate of a certain conductivity type having a main surface, with said substrate having a prescribed impurity concentration for said certain conductivity type;
a charge storage capacitor and a write/read transistor having a gate formed on said main surface; and
a continuous buried layer formed at two depths in said substrate under both said write/read transistor and said charge storage capacitor and having an impurity concentration higher than that in said substrate for said certain conductivity type,
wherein said continuous buried layer is formed at a first depth beneath the capacitor and at a second depth greater than the first depth beneath said transistor gate, said buried layer being vertically separated from said write/read transistor and said charge storage capacitor.

8. A semiconductor memory device according to claim 7, wherein
the peak value of the impurity concentration of said buried layer is in the range of $1 \times 10^{17}$ to $1 \times 10^{19}/cm^3$.

9. A semiconductor memory device according to claim 7, wherein the conductivity type of said substrate is of a P type, said capacitor is of a MOS type having a Hi-C structure with said Hi-C structure including an N layer and a P layer along the main surface of said substrate for providing an additional P-N junction capacitance, and said P layer and said buried layer are almost contiguously formed together in said substrate.

10. A semiconductor memory device according to claim 8, wherein the conductivity type of said substrate is of a P type, said capacitor is of a MOS type having a Hi-C structure, with said Hi-C structure including an N layer and a P layer along the main surface of said substrate for providing an additional P-N junction capacitance, and said P layer and said buried layer are almost contiguously formed together in said substrate.

11. A semiconductor memory device according to claim 7, wherein the conductivity type of said substrate is of an N type, said capacitor is of a MOS type having a Hi-C structure, with said Hi-C structure including a P layer and an N layer along the main surface of said substrate for providing an additional P-N junction capacitance, and said N layer and said buried layer are almost contiguously formed together in said substrate.

12. A semiconductor memory device according to claim 8, wherein the conductivity type of said substrate is of an N type, said capacitor is of a MOS type having a Hi-C structure, with said H-C structure including a P layer and an N layer along the main surface of said substrate for providing an additional P-N junction capacitance, and said N layer and said buried layer are almost contiguously formed together in said substrate.

13. A semiconductor memory device formed from:
a semiconductor substrate of a first conductivity type with a first impurity concentration, and having a main surface, comprising:
a charge storage capacitor and a write/read transistor having a gate; and
a continuous buried layer having at least a first depth beneath the capacitor and a second depth greater than the first depth beneath said transistor gate, said continuous buried layer having an impurity concentration higher than said first impurity concentration,
wherein said continuous buried layer is almost contiguously formed with said capacitor, and said continuous buried layer is vertically separated from said charge storage capacitor and said write/read transistor.

14. A semiconductor memory device according to claim 11, wherein said capacitor is of a MOS type having a Hi-C structure with said Hi-C structure including an N layer and a P layer along the main surface of said substrate for providing an additional P-N junction capacitance.

* * * * *